United States Patent [19]

Tissot

[11] 4,090,655
[45] May 23, 1978

[54] METHOD FOR INSURING SOLDERED CONNECTIONS

[76] Inventor: Pierre L. Tissot, 863 Via de la Paz, Pacific Palisades, Calif. 90272

[21] Appl. No.: 805,658

[22] Filed: Jun. 13, 1977

[51] Int. Cl.² ............................................. B23K 21/00
[52] U.S. Cl. ................................ 228/103; 228/180 A; 228/904
[58] Field of Search ................... 228/103, 179, 180 R, 228/180 A, 203, 904

[56] References Cited

U.S. PATENT DOCUMENTS

| | | | |
|---|---|---|---|
| 2,657,458 | 11/1953 | Passel | 228/904 X |
| 3,662,454 | 5/1972 | Miller | 228/904 X |
| 3,763,545 | 10/1973 | Spanjer | 228/103 |
| 4,013,212 | 3/1977 | Miller | 228/203 |
| 4,028,143 | 6/1977 | Stayner | 228/180 R |

Primary Examiner—Donald G. Kelly
Attorney, Agent, or Firm—Ralph B. Pastoriza

[57] ABSTRACT

Stripped wire ends are coated with a "solder friendly" resin such that when they are placed in physical contact with terminals during assembly of electrical circuitry preparatory to soldering the same to the terminals, there is no appreciable conduction. After a routine soldering operation, the resin melts and vaporizes so that a solid electrical connection results, the resin itself serving to inhibit oxidation of the soldered connection. When a routine quality control testing operation is carried out on the electrical circuitry, any overlooked soldered connections will be immediately indicated by non conduction or poor conduction of the unsoldered portions as a result of the presence of the resin. These overlooked unsoldered connections can thus be immediately corrected. In the absence of the resin, the routine quality control testing would indicate a proper connection merely because of the physical contact of the wire with the terminal even though not soldered.

3 Claims, 6 Drawing Figures

METHOD FOR INSURING SOLDERED CONNECTIONS

This invention relates generally to electrical circuitry and more particularly to a method for insuring properly soldered connections in the assembly of such circuitry.

BACKGROUND OF THE INVENTION

In the early days of assembly of electrical circuits, wires were attached to terminal points by simple screws or screws and nuts. In the next "Radio" generation, wire connections were made by threading the same through solder lugs for ultimate hard soldering later on. The soldering processes themselves evolved from simple hand soldering to "dip" type soldering wherein a multiple number of connections were all soldered simultaneously. In either situation, the wires have their ends stripped and are placed into physical contacts with terminals formed by perforations; for example, holes in a printed circuit board. Normal continuity existed even though the particular wire was not soldered to the terminal point. For example, the wire and might be bent through a perforation or opening in a printed circuit board and thus maintain physical contact with the proper terminal even though "loose" in the connection. Similarly, the wire ends might be wrapped about a terminal post thereby effecting physical and electrical contact therewith even though not soldered.

After the various wire ends are physically placed in physical contact with the terminals, the routine soldering operation is carried out either by hand or in some instances by automatic soldering equipment.

After the routine soldering operation, the normal quality control testing of the circuitry is carried out. Since this testing involves continuity and conduction tests of various terminal points, an unsoldered terminal connection will not be detected and as a result a piece of equipment may be shipped out with overlooked solder joints.

Because of continuity and conduction of the wire ends with the terminal points even though not soldered, the equipment may operate satisfactorily even for several months. Ultimately, however, the shiny wire core end will tend to corrode or oxidize with the result of a poor connection and possible arcing which latter phenomenon can be very detrimental to modern solid-state components.

While the various terminal points can be visually inspected to make sure that proper soldering has been carried out, such visual inspection is subject to human error and thus there still exists the problem of defective equipment being purchased by the ultimate consumer.

BRIEF DESCRIPTION OF THE PRESENT INVENTION

Bearing the foregoing in mind, the present invention contemplates a novel method and product for insuring that all terminal connections in the assembly of electrical circuitry are properly soldered, all to the end that problems associated with overlooked solder connections in equipment passed to the ultimate consumer are avoided.

More particularly, the method of the invention contemplates the steps of coating wires to be soldered to given terminals with a "solder friendly" resin such that when the ends of the wires are placed into physical contact with respective terminals preparatory to soldering the ends to the terminals, there is no appreciable conduction between the ends of the wires and the terminals. In the next step of the method, the routine soldering operation of the ends of the wires to the terminals is carried out, the soldering itself melting and evaporating the resin so that proper conductivity between the wire end and terminal is assured. Thereafter, the usual quality control testing will indicate proper conductivity and continuity in the electrical circuitry. In the event that there was overlooked in the soldering of any terminal connection, such would be immediately detected by this testing and proper soldering of this particular terminal can then be carried out. It is thus assured that all terminal connections will be properly soldered.

The wire product used in this assembly operation can be precoated with the "solder friendly" resin during manufacture or, should large stocks of conventional wire be on hand, the ends can be stripped and dipped into a melted solution of the resin for coating.

BRIEF DESCRIPTION OF THE DRAWINGS

A better understanding of this invention will be had by now referring to the accompanying drawings in which.

DETAILED DESCRIPTION OF THE PREFERRED EMBODIMENT

Figure 1:
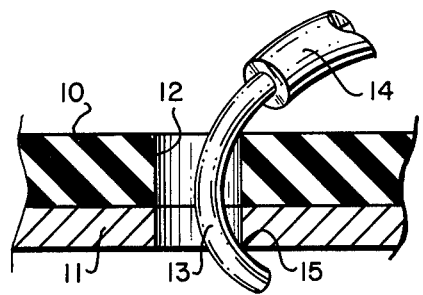
FIG. 1 is an enlarged fragmentary cross section of a "etch-foil" type circuit board showing a wire physically placed into a terminal preparatory to soldering in accord with prior art or known techniques.

Referring first to FIG. 1, there is shown a fragmentary greatly enlarged cross section of a typical circuit board up of an insulative sub-strate 10 with copper foil 11 defining a circuit secured to the base. A terminal connection point is defined by a perforation or hole 12 into which a wire core 13 stripped of the wire insulation 14 may be physically placed preparatory to soldering as shown.

In modern, near surgically clean environments, the wire core 13 is shiny and provides an excellent electrical connection with the shiny copper foil 11 at its physical contact point therewith such as indicated at 15, even though no soldering has as yet taken place.

Figure 2:
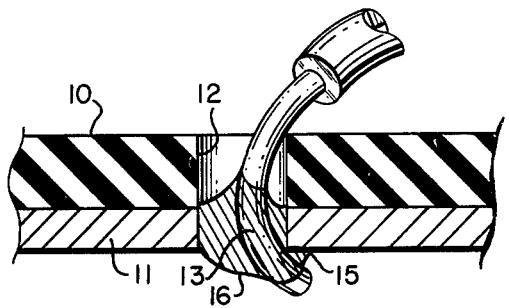
FIG. 2 is a view similar to FIG. 1 showing the terminal connection after soldering.

FIG. 2 illustrates the same terminal connection of FIG. 1 after soldering wherein solder 16 permanently secures the wire core 13 into electrical conductive relationship with the copper foil 11.

From the foregoing, it can now be appreciated that in a large assembly operation, should one of the terminal connections not be soldered; that is, should a terminal point to be soldered be overlooked, electrical continuity will still exist at the point such as the point 15 in FIGS. 1 and 2 such that during quality control testing, the overlooked solder connection will not be detected. As a result, the equipment will pass inspection and the flaw may not be detected for several months after oxidation and aging spoil the physical connection of the unsoldered terminal.

Figure 3:
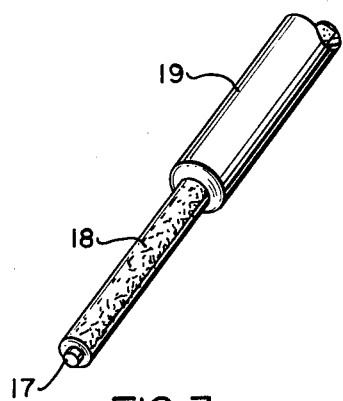
FIG. 3 is a fragmentary perspective view of wire treated in accord with the present invention for use in electrical circuitry assembly.

Referring now to FIG. 3, in accord with the present invention the bare wire core 17 is coated with a "solder friendly" resin material 18. This coated wire may or may not be provided with further plastic insulation 19. Such coating of the wire can take place during initial manufacture of the wire.

Figure 4:
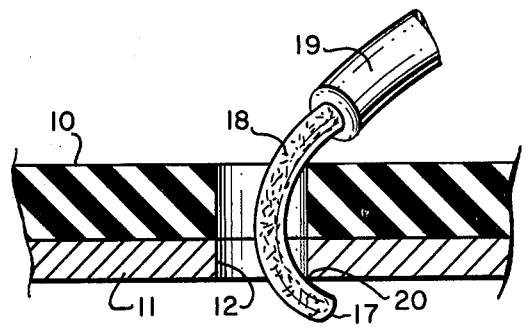
FIG. 4 illustrates the wire of FIG. 3 in physical position preparatory to soldering to a terminal in a printed circuit board.

Referring to FIG. 4, when the wire of FIG. 3 now has its end placed into physical contact with the terminal opening 12 of the circuit board, there will not result any electrical connection between the wire 17 and the copper foil 11 because of the insulation properties of the resin 18. Accordingly, it will be evident that should the solder connection be overlooked, the routine continuity testing will immediately indicate the overlooked solder terminal and proper soldering can take place.

Figure 5:
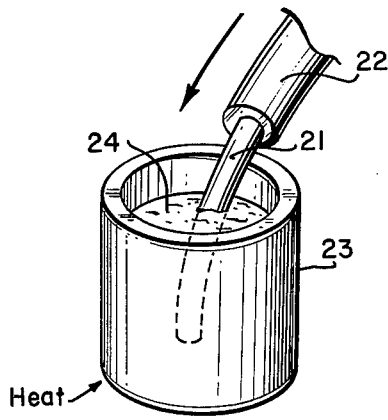
FIG. 5 illustrates one method of applying a resin coating to a stripped wire end in accord with this invention; and, FIG. 6 shows a series of electrical terminals to which wires are to be soldered in an assembly operation carried out in accord with this invention.

In case an assembly operator has a large stock of conventional wire, the method of the present invention can still be carried out by simply stripping the end of the wire and dipping the same into a melted solution of the resin to provide the temporary insulative coating. This operation is illustrated in FIG. 5 wherein a wire core 21 stripped free of the normal plastic insulation 22 is dipped into a container 23 of resin 24. The resin is in a melted or liquid state as by appropriate application of heat.

Figure 6:
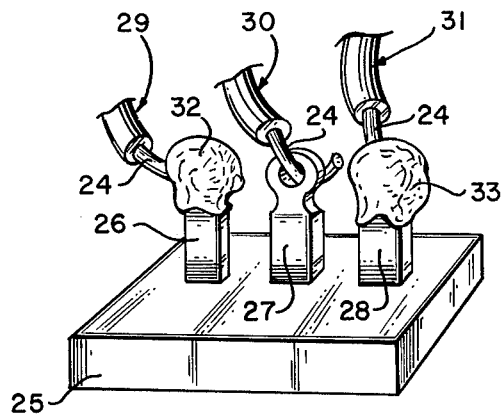

FIG. 6 illustrates a further example of the invention wherein there is shown a plastic block 25 with three terminal lugs 26, 27 and 28 extending therefrom. Three wires designated generally by the numerals 29, 30 and 31 are to be connected to these lugs. The stripped ends of these wires have all been treated with the resin coating 24 described in FIG. 5 so that when they are initially tied to the terminal lugs 26, 27 and 28 there is no appreciable electrical conductivity.

In FIG. 6, the wires 29 and 31 are shown properly soldered to the terminal lugs 26 and 28 respectively as indicated by the solder globules 32 and 33. For the sake of illustration, the center terminal lug 27 has not been soldered to the wire 30; that is, this soldered connection was overlooked.

In routine electrical testing for continuity, it will then be immediately evident that the soldering of the center terminal to the wire 30 was overlooked. Appropriate soldering of this particular terminal is then carried out.

Several commercially available resins of natural or synthetic origin have been found to be satisfactory for use in accord with this invention. However, it is desirable that the adherents of the particular resin to the metallic wire be improved to resist abrasion such as might occur if the resin coated wires are surrounded by a plastic insulative coating and stripped on automatic equipment. Towards this end, of improving the resin, plasticizing agents may be admixed with appropriate rosins. In accord with the preferred product of this invention, an appropriate pliable resinous film with high adherence and "solder friendliness" is formed by melting together a mixture of about ¾ by volume of refined natural pine rosin with about ⅛ beeswax and about ⅛ of an appropriate plasticizing agent; for example, "HOT GLUE" manufactured by USM Corp., Reading, Pa.

It should be understood that the method and product of this invention are equally applicable to spot welded electrical connections as opposed to soldered connections. In either operation, the heat of the spot welding or soldering will remove the insulative properties of the resin coating and result in a proper electrical connection.

A further advantage in the present invention is the fact that the resinous coating will keep air away from the wire surface thus preventing natural oxidation while in storage.

The present invention is to be distinguished from the normal insulative coating applied to wire. The purpose for the normal insulative coating on wire is to actually insulate the wire. In the present invention, the only concern really is to "spoil" a physical connection by the "solder friendly" resin layer which can be quite thin. Even if the layer of coating is not perfect so that there are exposed spots, the desired end effect will still be achieved since the terminal connection prior to soldering will show some resistance. By comparison, the "resistance" of a properly soldered terminal is zero for all practical purposes.

I claim:

1. A method of insuring soldered connections in the manufacture of electrical circuitry, including the steps of:
    (a) coating wires to be soldered to given terminals with a "solder friendly" resin such that when the ends of said wires are placed into physical contact with respective terminals preparatory to soldering the ends to the terminals, there is no appreciable conduction between the ends of said wires and said terminals;
    (b) carrying out a soldering operation of the ends of the wires to the terminals;
    (c) testing the electrical circuitry for proper conductivity and continuity after completion of said routine soldering operation; and,
    (d) soldering any wire ends to their appropriate terminals which were overlooked during said routine soldering operation as indicated by non-conduction during testing of said electrical circuitry whereby it is assured that all connections in said circuitry are properly soldered.

2. The method of claim 1, in which the coating of said wires is effected during manufacture of the wires.

3. The method of claim 1, in which the coating of said wires is effected by stripping the wire ends to be soldered and dipping the stripped ends in a resin solution to provide the resin coating.

* * * * *